United States Patent
Yomori et al.

(10) Patent No.: US 9,349,771 B2
(45) Date of Patent: May 24, 2016

(54) MICROLENS FORMING METHOD AND SOLID-STATE IMAGE SENSOR MANUFACTURING METHOD

(71) Applicant: CANON KABUSHIKI KAISHA, Tokyo (JP)

(72) Inventors: Mitsuhiro Yomori, Kawasaki (JP); Masaki Kurihara, Koza-gun (JP); Yasuhiro Sekine, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/591,467

(22) Filed: Jan. 7, 2015

(65) Prior Publication Data
US 2015/0214270 A1 Jul. 30, 2015

(30) Foreign Application Priority Data

Jan. 27, 2014 (JP) .................................. 2014-012765
Nov. 18, 2014 (JP) .................................. 2014-234005

(51) Int. Cl.
*H01L 27/146* (2006.01)
*G02B 3/00* (2006.01)

(52) U.S. Cl.
CPC ........ *H01L 27/14685* (2013.01); *G02B 3/0018* (2013.01); *G02B 3/0043* (2013.01); *H01L 27/14627* (2013.01)

(58) Field of Classification Search
CPC ............................ H01L 27/146; G02B 3/0025
See application file for complete search history.

(56) References Cited

U.S. PATENT DOCUMENTS

| | | | |
|---|---|---|---|
| 8,309,000 B2 | 11/2012 | Fujita et al. | |
| 8,415,193 B2 | 4/2013 | Ootake | |
| 8,704,323 B2 | 4/2014 | Ootake | |
| 2006/0292735 A1* | 12/2006 | Boettiger | H01L 27/14641 438/70 |
| 2012/0092747 A1 | 4/2012 | Martin et al. | |
| 2015/0085496 A1* | 3/2015 | Okuno | G02B 3/0043 362/311.03 |

FOREIGN PATENT DOCUMENTS

| | | |
|---|---|---|
| CN | 1933149 A | 3/2007 |
| JP | 2003-172804 A | 6/2003 |
| JP | 2009-199045 A | 9/2009 |
| JP | 2011-029277 A | 2/2011 |

OTHER PUBLICATIONS

First Office Action in Chinese Application No. 201510031490.6 (notified Dec. 21, 2015).

* cited by examiner

*Primary Examiner* — Mamadou Diallo
(74) *Attorney, Agent, or Firm* — Fitzpatrick, Cella, Harper & Scinto

(57) ABSTRACT

A microlens forming method, comprising etching a first member and a second member arranged on the first member, the second member including a concavo-convex shape, and forming a microlens from the first member, wherein, the etching of the first and the second members is performed under a condition that an etching rate of the first member is higher than that of the second member, a portion of the first member under the concave portion is exposed during the etching of the second member, and the exposed portion of the first member is removed in the etching of the first member.

13 Claims, 9 Drawing Sheets

FIG. 2A-1
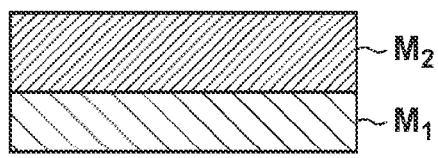
FIG. 2B-1
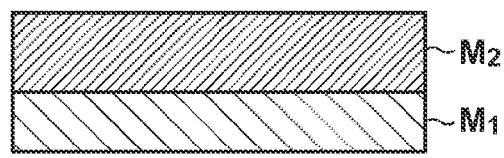
FIG. 2A-2
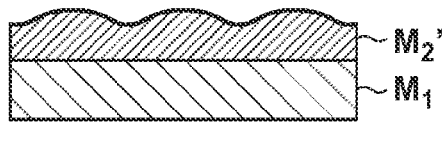
FIG. 2B-2
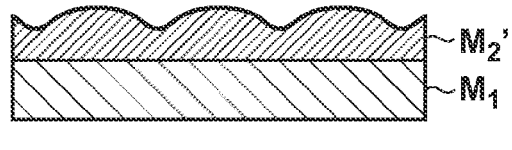
FIG. 2A-3
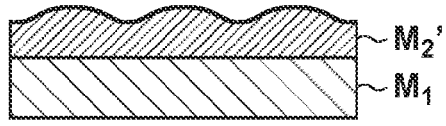
FIG. 2B-3
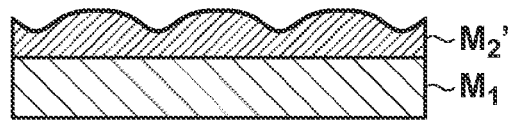
FIG. 2A-4
FIG. 2B-4

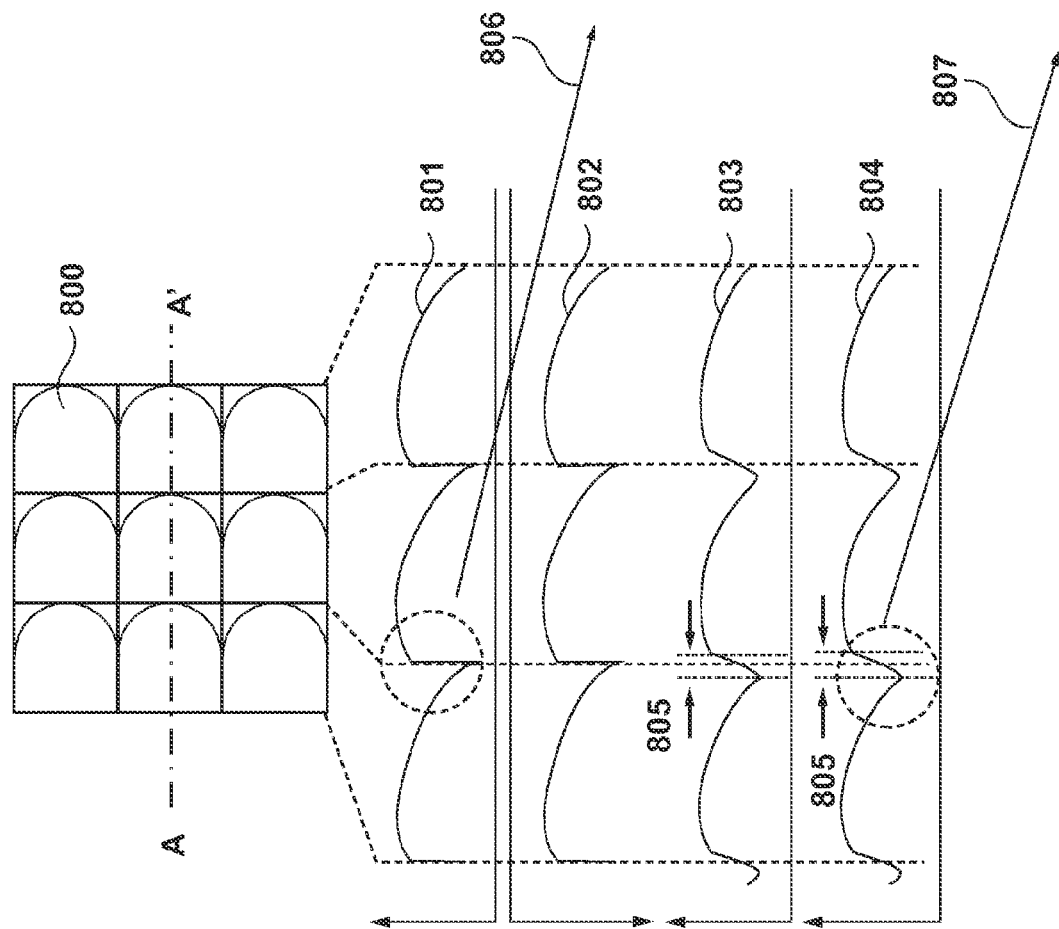

F I G. 8B
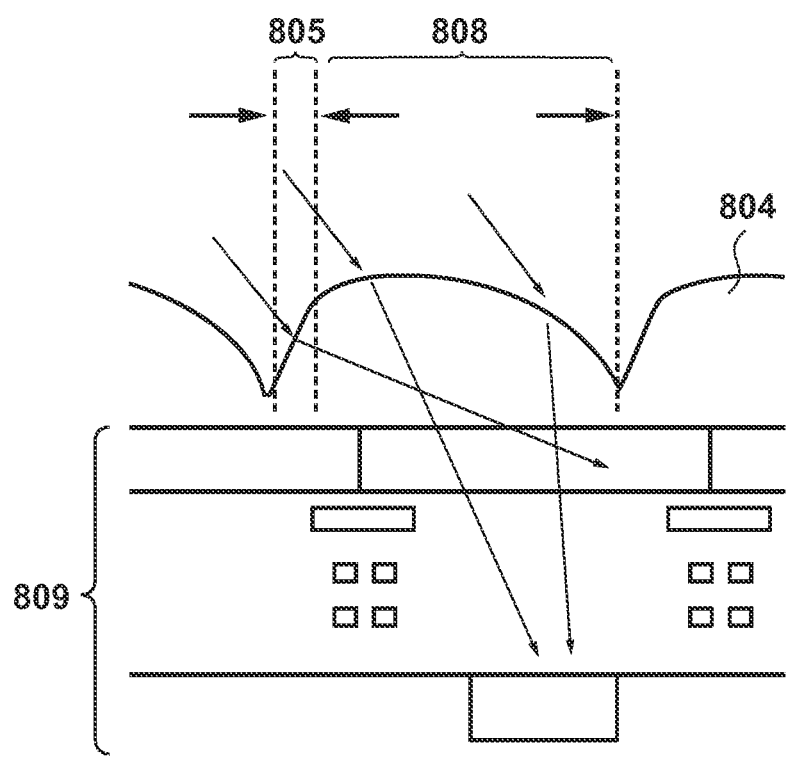

MICROLENS FORMING METHOD AND SOLID-STATE IMAGE SENSOR MANUFACTURING METHOD

BACKGROUND OF THE INVENTION

1. Field of the Invention

The present invention relates to a microlens forming method and a solid-state image sensor manufacturing method.

2. Description of the Related Art

Japanese Patent Laid-Open No. 2003-172804 discloses a microlens forming method. More specifically, first, a plurality of lens patterns are formed on a flat translucent member. The plurality of lens patterns are formed by patterning and reflowing a lens member formed on the translucent member. Gaps exist between adjacent lens patterns. After that, portions out of the translucent member which are exposed to the gaps between the lens patterns are etched using the plurality of lens patterns as a mask, thereby forming concave shapes (grooves) in regions of the translucent member between the lens patterns.

According to this method, a microlens array without gaps between adjacent microlenses is formed by the lens patterns and the translucent member with the concave shapes.

According to the method of Japanese Patent Laid-Open No. 2003-172804, the concave shapes in the translucent member are formed by removing only portions out of the translucent member which are exposed by the lens patterns to the gap portions between the lenses from the beginning by etching. For this reason, this method cannot arbitrarily control the concave shapes, and it is difficult to control the shape of the whole microlenses including the concave shapes.

SUMMARY OF THE INVENTION

The present invention provides a technique advantageous in controlling the shape of a microlens.

One of the aspects of the present invention provides a microlens forming method, comprising a first step of forming, on a first member, a second member made of a material different from the first member, a second step of shaping an upper surface of the second member into a concavo-convex shape including a convex portion and a concave portion around the convex portion by forming a resist on the second member, performing exposure processing using a grayscale mask, and then etching the second member, and a third step of forming a microlens from at least the first member by etching the shaped second member and the first member, wherein in the third step, etching of the second member and etching of the first member are performed under a condition that an etching rate of the first member is higher than the etching rate of the second member, a portion of the first member under the concave portion of the second member is exposed during the etching of the second member, and the exposed portion of the first member is removed in the etching of the first member.

Further features of the present invention will become apparent from the following description of exemplary embodiments with reference to the attached drawings.

BRIEF DESCRIPTION OF THE DRAWINGS

FIGS. 2A-1 to 2A-4 and 2B-1 to 2B-4 are views for explaining an example of a microlens forming method;

FIG. 3 is a view for explaining the convex portions and the concave portions of microlens;

FIG. 4 is a view for explaining the spherical shape of the microlens;

FIGS. 5A-1 to 5A-4 and 5B-1 to 5B-4 are views for explaining an example of a microlens forming method;

FIGS. 6A-1 to 6A-4 and 6B-1 to 6B-4 are views for explaining an example of a microlens forming method;

FIGS. 8A-1 to 8A-5 and 8B are views for explaining an example of an asymmetric microlens; and FIGS. 9A, 9B-1, 9B-2, 9C-1, and 9C-2 are views for explaining an example of an asymmetric microlens forming method.

DESCRIPTION OF THE EMBODIMENTS (First Embodiment)

The first embodiment will be described with reference to FIGS. 1 to 3.

Figure 1:
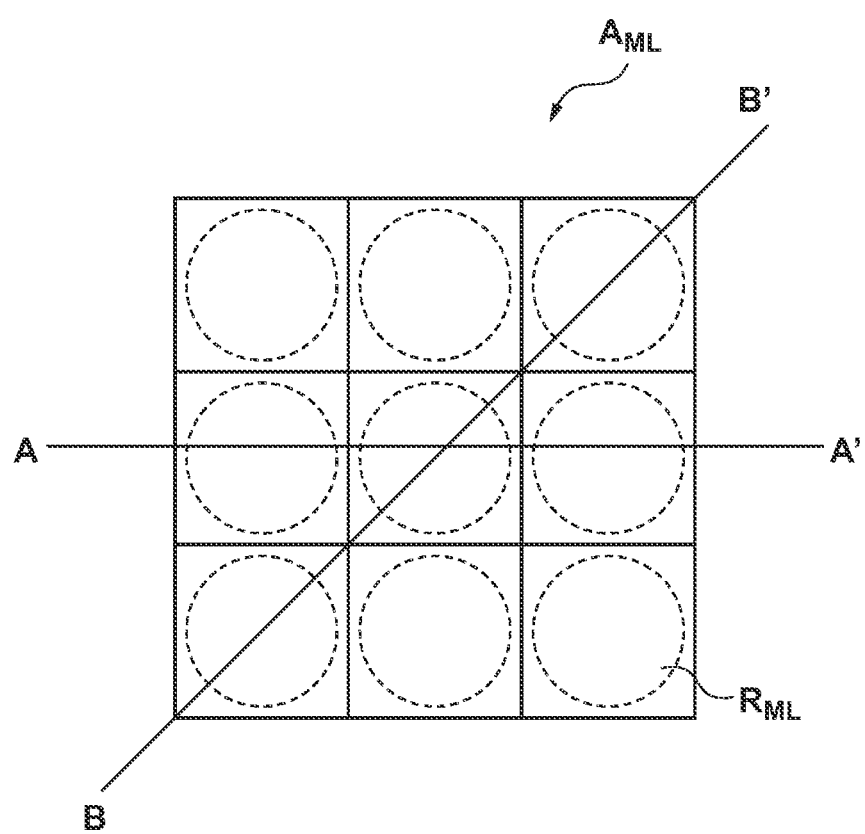
FIG. 1 is a view for explaining a microlens array.

FIG. 1 is a schematic view (plan view) for explaining a microlens array $A_{ML}$. The microlens array $A_{ML}$ is formed by arranging a plurality of microlenses in an array. The microlens array $A_{ML}$ having 3 rows×3 columns is illustrated for a descriptive convenience. The solid lines in FIG. 1 indicate unit microlens regions $R_{ML}$, and the broken lines indicate the convex portions of the microlenses.

Note that in this specification, a direction A-A' in FIG. 1 will be referred to as a "direction toward a side", and a direction B-B' will be referred to as a "direction toward an angle" hereinafter. Out of the convex portions of the plurality of (here, nine) microlenses shown in FIG. 1, the convex portion of interest at the center will be referred to as a "first convex portion". A concave portion exists around the first convex portion. In this example, the concave portion wholly surrounds the convex portion. Four convex portions adjacent to the first convex portion via the concave portion in the direction toward a side (upward/downward and leftward/rightward directions in FIG. 1) will be referred to as "second convex portions". Four convex portions adjacent to the first convex portion via the concave portion in the direction toward an angle (oblique direction in FIG. 1) will be referred to as "third convex portions". That is, the apexes of the third convex portions are located at positions farther from the apex of the first convex portion than the apexes of the second convex portions. Let P be the distance between the apex of the first convex portion and the apex of each second convex portion. The distance between the apex of the first convex portion and the apex of each third convex portion is, for example, $P \times 2^{1/2}$.

FIGS. 2A-1 to 2A-4 and 2B-1 to 2B-4 are schematic views for explaining the steps of a microlens forming method according to this embodiment. FIGS. 2A-1 to 2A-4 illustrate the forms of the steps in the direction toward a side. FIGS. 2B-1 to 2B-4 illustrate the forms of the steps in the direction toward an angle in correspondence with FIGS. 2A-1 to 2A-4, respectively.

First, as shown in FIGS. 2A-1 and 2B-1, a second member $M_2$ different from a first member $M_1$ used to form microlenses is formed on the member M. The member $M_1$ is formed by, for example, spin coating (and baking: 230° C.·6 min) or the like on a substrate on which a predetermined semiconductor element and the like are formed. As the material of the member $M_1$, for example, an acrylic resin is usable. The member $M_2$ is formed by spin coating (and baking: 110° C., 1.5 min) or the like on the member $M_1$. As the material of the member $M_2$, for example, a styrene resin is usable. In this way, a resin film that is the stacked film of a resin layer serving as the member $M_1$ and a resin layer serving as the member $M_2$ is obtained. As the materials of the members $M_1$ and $M_2$, resin materials other than those described above or inorganic materials such as silicon oxide or silicon nitride may be used.

Figures 1, 5A:
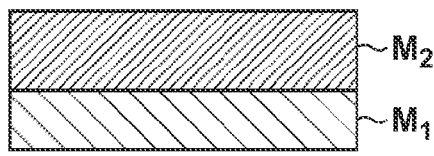
Figures 1, 5B:
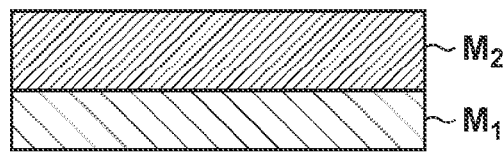
Figures 2, 5A:
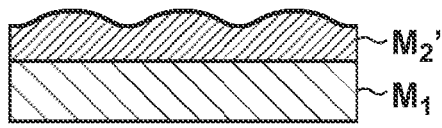
Figures 2, 5B:
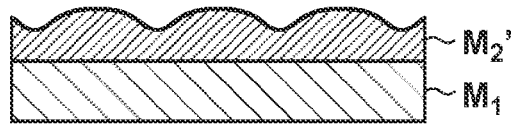
Figures 3, 5A:
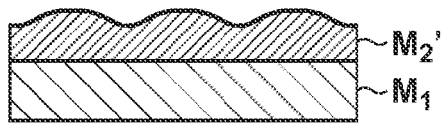
Figures 3, 5B:
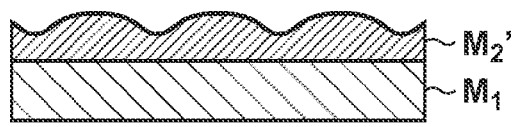
Figures 4, 5A:
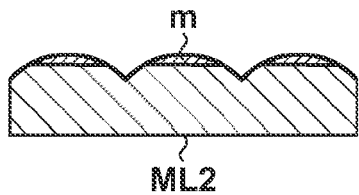
Figures 4, 5B:
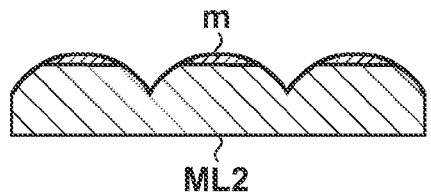

Next, as shown in FIGS. 2A-2 and 2B-2, the member $M_2$ is shaped such that its upper surface has a concavo-convex shape. The shaped member $M_2$ is indicated by "$M_2$'". The member $M_2$' includes a plurality of convex portions and concave portions between the plurality of convex portions. The concavo-convex shape of the upper surface of the member $M_2$' is formed by the convex portions and the concave portions around the convex portions. An example will be described here, in which the concave portions wholly surround each convex portion, and the member $M_2$' covers the entire upper surface of the member $M_1$. If the entire upper surface of the member $M_1$ is not covered by the member $M_2$', the pattern to be formed on the member $M_1$ is determined depending on the shape of the exposed portion of the upper surface of the member $M_1$ when etching the member $M_1$ using the member $M_2$' as a mask. Then, the shape of the member $M_2$' is not sufficiently reflected on the member $M_1$, and a microlens having a desired shape cannot be formed. Hence, in the concave portion, at least part of the upper surface of the member $M_1$ is preferably covered by the member $M_2$'. On the other hand, the present invention can also incorporate an arrangement example in which the concave portions of the member $M_2$' do not exist at part of the periphery of the convex portions, and the member $M_1$ is partially exposed. More specifically, the present invention can also incorporate an arrangement example in which the upper surface of the member $M_1$ is exposed in the direction toward an angle that is the B-B' direction but not in the direction toward a side that is the A-A' direction.

The member $M_2$' has first to third convex portions corresponding to the plurality of convex portions of the microlens array $A_{ML}$. This step will be referred to as a "first shaping step". This step can be performed by, for example, exposing the member $M_2$' using a photomask and then developing it. In this embodiment, a grayscale mask was used as the photomask. The exposure amount was set to 2,000 to 2,700 J/m². As the developer, TMAH (tetramethylammonium hydroxide) 2.38% was used, and the developing time was set to 45 sec. Note that this step can be performed in both forms of positive type and negative type.

The grayscale mask is a multi-tone mask having an exposure light transmittance distribution. The transmittance distribution is formed by, for example, the distribution of the thicknesses of light-shielding elements or the distribution of the densities of fine dot-shaped light-shielding elements. For example, consider the form of positive type. The transmittance of the exposure light is low in the central region (that is, region to form the convex portion of a microlens) of the unit microlens region and high in the peripheral region (that is, region to form the concave portion). Hence, after development, the convex portion of the member $M_2$' is formed in the central region where the transmittance is low (the exposure light amount is small), and the concave portion of the member $M_2$' is formed in the peripheral region where the transmittance is high (the exposure light amount is large). This forming method is advantageous in controlling the shape of the microlens as compared to a case where the member $M_2$ is shaped into a lens shape by, for example, reflowing, as will be described later in detail.

Note that after development, bleaching (exposure amount 12,000 J/m²) and baking (125° C.·5 min, 140° C.·5 min, 200° C.·5 min) of the shaped member $M_2$' (having an upper surface with a concavo-convex shape) can be performed.

After that, the shaped member $M_2$' and part of the member $M_1$ are etched, thereby shaping a member ML. This step will be referred to as a "second shaping step". With this step, the microlens array $A_{ML}$ by a plurality of microlenses ML is formed.

FIGS. 2A-3 and 2B-3 show the state of the member $M_2$ during etching.

The etching conditions were set to
RF power: 1,400 W
pressure: 40 mT
$C_4F_8$: 10 sccm
$CF_4$: 110 sccm
etching time: 300 sec FIGS. 2A-4 and 2B-4 show a state after etching of part of the member M. With the etching, the concavo-convex shape of the member $M_2$' is transferred to the member $M_1$, and the microlens array $A_{ML}$ including the microlenses ML corresponding to the convex portions of the member $M_2$' is formed.

The etching is performed under the condition that the etching rate of the member $M_1$ is higher than that of the member $M_2$' ($M_2$). In this embodiment, the etching rate of the member $M_1$ was set to 60 Å/sec, and the etching rate of the member $M_2$' was set to 45 Å/sec.

When these etching rates are used, the etching rate ratio between the members $M_1$ and $M_2$' is 4/3. Hence, for example, letting H be the height difference of the concavo-convex shape (height difference between the convex portions and the concave portions) of the member $M_2$', the height difference of the concavo-convex shape of the member $M_1$ after the second shaping step (partially etched) is about H×4/3.

More specifically, with the etching, the upper surface of the member $M_1$ is partially exposed first at the concave portions of the member $M_2$'. For example, when the curvature of the concavo-convex shape of the member $M_2$' in the direction toward a side and the curvature in the direction toward an angle equal each other, first, the upper surface of the member $M_1$ is exposed at the concave portions in the direction toward an angle (portions between the first convex portion and the third convex portions described above). After that, the upper surface of the member $M_1$ is exposed at the concave portions in the direction toward a side (portions between the first convex portion and the second convex portions described above). Then, the convex portions of the member $M_2$' are etched, and the exposed portions of the member $M_1$ are removed by the etching.

Hence, according to this forming method, the height difference of the concavo-convex shape of the member $M_1$ is larger than the height difference of the concavo-convex shape of the member $M_2$'. From another viewpoint, the member $M_1$ is shaped into a concavo-convex shape having a curvature larger than that of the concavo-convex shape of the member $M_2$'. In other words, according to this forming method, a concavo-convex shape that enhances the concavo-convex shape of the member $M_2$' is formed on the upper surface of the member $M_1$.

As described above, the etching is performed under the condition that the etching rate of the member $M_1$ is higher than that of the member $M_2$'. According to this etching, the concave portions of the member $M_1$ (that is, the shapes of the boundary portions between the adjacent microlenses ML) become acuter than those of the member $M_2$'. As a result, a so-called gapless microlens array $A_{ML}$ having a short distance between the adjacent microlenses ML is formed.

According to the above-described forming method, the shape of the microlenses ML depends on the shape of the member $M_2$' and the etching rate ratio between the members $M_1$ and $M_2$'. Hence, to form the microlenses ML into a desired shape, control of concavo-convex shape formation on the member $M_2'$ in the first shaping step and etching rate setting for the members $M_1$ and $M_2'$ in the second shaping step are appropriately done.

In summary, the first shaping step can be done by performing exposure processing using a grayscale mask as a photomask and then performing development processing. The second shaping step after that is done under the condition that the etching rate of the member $M_1$ is higher than that of the member $M_2'$. Hence, according to this forming method, when forming the microlenses ML, that is, when transferring the concavo-convex shape of the member $M_2'$ to the member $M_1$, a concavo-convex shape having a height difference larger than that of the concavo-convex shape of the member $M_2'$ is formed on the member $M_1$ due to the etching rate ratio between the members $M_1$ and $M_2'$. From another viewpoint, this forming method can control the shape of the microlenses at a resolution higher than that of the grayscale mask used.

The shape of the microlenses ML conforms to the concavo-convex shape of the member $M_2'$ in the first shaping step and can therefore be controlled to an arbitrary shape. Hence, this forming method is also advantageous in forming, for example, the gapless microlens array $A_{ML}$. To accurately control the shape of the microlenses ML, the etching rate ratio between the members $M_1$ and $M_2'$ is set such that the difference between the etching rate of the member $M_1$ and that of the member $M_2'$ falls within the range of, for example, 5 Å/sec to 50 Å/sec.

Figure 3:
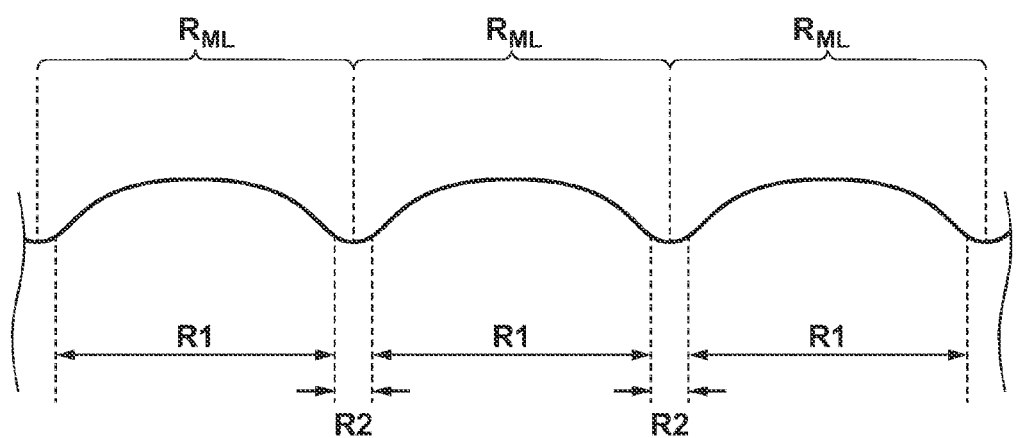

FIG. 3 is a schematic view for explaining the sectional shape of the microlens array $A_{ML}$ in the direction toward a side. The unit microlens region $R_{ML}$ (see FIG. 1) is divided into a first region R1 (central region) and a second region R2 (peripheral region). The region R1 is, for example, a region having a first curvature with which the upper surface of the microlens ML has a convex shape. The region R2 is, for example, a region having a second curvature with which the upper surface of the microlens ML has a concave shape. From another viewpoint, the boundary between the regions R1 and R2 can be formed by an inflection point of the upper surface shape of the microlens ML. The broken lines shown in FIG. 1 indicate the edges or outlines of the convex portions and correspond to the boundaries between the regions R1 and R2.

For example, the distance between the region R1 of a microlens (to be referred to as $ML_A$) and the region R1 of a microlens (to be referred to as $ML_B$) adjacent to the microlens $ML_A$ is preferably smaller than 1/10 the pitch (arrangement interval) of the microlenses ML. The gapless microlens array $A_{ML}$ having a high condensing rate can thus be obtained.

In the region R1, the upper surface of the microlens ML preferably forms a spherical shape (arcuate sectional shape). In this case, when the microlenses ML are applied to, for example, a solid-state image sensor such as a CMOS sensor, the light sensitivity or f-number (Fno) proportionality improves, and the sensor performance improves.

Figure 4:
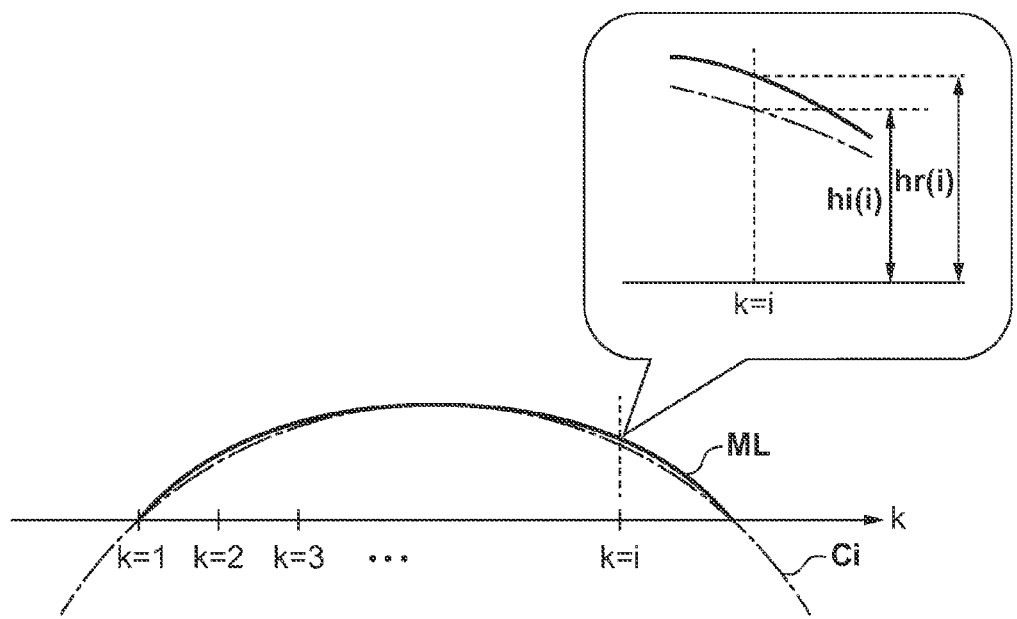

The spherical shape of the microlens ML will be described below with reference to FIG. 4. FIG. 4 is a schematic view for explaining the matching rate between the shape of the microlens ML in the region R1 and an ideal perfect sphere (sphere having a perfect circular shape on any section). The ideal perfect sphere is assumed to be a sphere Ci that overlaps the apex of the microlens ML and also overlaps the edge of the region R1.

The region R1 is divided into a predetermined matrix (predetermined number of rows×predetermined number of columns). Let hr be the height of the microlens ML at each lattice point i (i=1 to n) of the matrix, and hi(i) be the height of the ideal perfect sphere Ci. Note that n is an integer of 2 or more and represents the number of lattice points on the divided matrix. In addition, "height" is the height based on a position on the edge of the region R1.

When $\Delta h(i) \equiv |hr(i) - hi(i)|$, the matching ratio is defined as matching ratio $R_M \equiv (1 - \Sigma \Delta h(i)/\Sigma hi(i)) \times 100 [\%]$ ($\Sigma$ is the sum for i=1 to n).

When the matching ratio $R_M$ is calculated under this definition using, for example, a matrix of 41 rows 41 columns (n=41×41) and, for example, $R_M \geq 85\%$ is obtained, the microlens ML is considered to have a satisfactory spherical shape.

As described above, according to the forming method of this embodiment, the shape of the microlenses ML depends on the shape of the member $M_2'$ and the etching rate ratio between the members $M_1$ and $M_2'$. Hence, the conditions of the first shaping step and the second shaping step are selected in advance so as to form the microlenses ML having a desired spherical shape. More specifically, the exposure conditions are set, the grayscale mask used to form the concavo-convex shape of the member $M_2'$ to be formed is prepared, and the etching rate ratio is selected.

As described above, this embodiment is advantageous in controlling the shape of the microlenses ML, forming the gapless microlens array $A_{ML}$, and increasing the degree of integration of the microlens array $A_{ML}$.

For example, when forming a plurality of lens patterns by reflowing, a predetermined gap needs to be provided between adjacent lens patterns to prevent them from coming into contact. On the other hand, this embodiment is advantageous in forming the gapless microlens array $A_{ML}$, as described above.

In Japanese Patent Laid-Open No. 2003-172804 described in "BACKGROUND" above, after a plurality of lens patterns are formed by reflowing, a translucent member serving as an underlayer member is etched using the plurality of lens patterns as a mask to form concave shapes (grooves) in the translucent member. According to this method, however, it is difficult to control formation of the concave shapes. In addition, the lens patterns may be damaged or deformed by etching. On the other hand, this embodiment is advantageous in controlling the shape of the microlenses ML, as described above.

A method of completing formation of the microlenses only by exposure processing using a grayscale mask and development processing is also considerable. According to this method, however, it is difficult to accurately control the shape of the boundary portion between adjacent microlenses. Additionally, according to this embodiment, it is difficult to reduce the pitch of the microlenses (increase the degree of integration). On the other hand, this embodiment can control the shape of the microlenses ML at a resolution higher than that of the grayscale mask used, and is also advantageous in increasing the degree of integration.

(Second Embodiment)

The second embodiment will be described with reference to FIGS. 5A-1 to 5A-4 and 5B-1 to 5B-4. This embodiment is different from the above-described first embodiment mainly in that etching is performed in the second shaping step described above so that portions m of a member $M_2'$ remain at the apexes of microlenses. The member $M_2'$ ($M_2$) is made of a translucent material and can use a styrene resin, as in the first embodiment.

FIGS. 5A-1 to 5A-4 and 5B-1 to 5B-4 are schematic views for explaining the steps of a method of forming microlenses ML2 according to this embodiment, like FIGS. 2A-1 to 2A-4 and 2B-1 to 2B-4 (first embodiment). FIGS. 5A-1, 5B-1, 5A-2, and 5B-2 are the same as FIGS. 2A-1, 2B-1, 2A-2, and 2B-2, and a description thereof will be omitted here.

After that, etching in the above-described second shaping step is performed such that the portions m of the member $M_2'$ remain at the apexes of the microlenses. Here, the same etching conditions as in the first embodiment were used except that the etching time was set to 220 sec. FIGS. 5A-3 and 5B-3 show the state of the member $M_2'$ during etching. After that, the microlenses ML2 having the portions m of the member $M_2'$ at the apexes are formed, as shown in FIGS. 5A-4 and 5B-4.

This embodiment can shorten the etching time and is advantageous in improving the productivity. According to this embodiment, since the etching time is shortened, particle generation due to the etching can be prevented. Hence, this embodiment is also advantageous in improving the yield.

The microlenses ML2 are made of the materials of two layers, that is, members $M_1$ and $M_2'$ ($M_2$). For this reason, when applying the microlenses to a solid-state image sensor, the difference between the refractive index of the member $M_1$ and that of the member $M_2$ is preferably set to 0.1 or less. This can prevent color unevenness of an image obtained from the solid-state image sensor. Since the portions m of the member $M_2'$ are arranged only at the apexes (almost level portions) of the microlenses ML2, the influence of the structure on the condensing rate of the microlenses ML2 is small.

As described above, this embodiment can obtain the same effects as in the first embodiment and is also advantageous in improving the productivity and the yield.

(Third Embodiment)

The third embodiment will be described with reference to FIGS. 6A-1 to 6A-4 and 6B-1 to 6B-4 and 7. In the above-described first embodiment, when transferring the concavo-convex shape of the member $M_2'$ to the member $M_1$, a concavo-convex shape having a height difference larger than that of the concavo-convex shape of the member $M_2'$ is formed on the member $M_1$ by the etching rate difference between the members $M_1$ and $M_2'$. This microlens shape control is applicable to another form. For example, in the first shaping step, the member $M_2'$ may be shaped such that the upper surface obtains a concavo-convex shape having different curvatures in the direction toward a side and the direction toward an angle.

Figures 1, 6A:
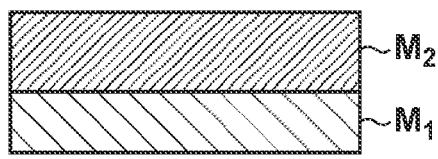
Figures 1, 6B:
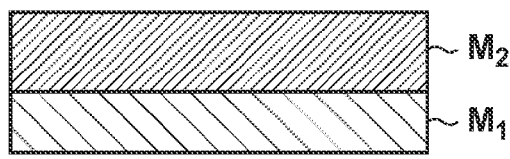
Figures 2, 6A:
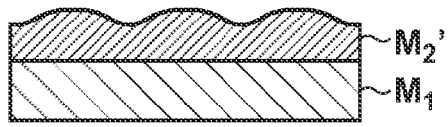
Figures 2, 6B:
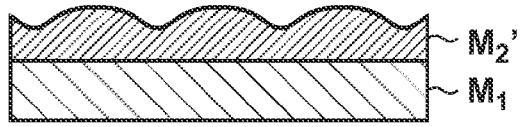
Figures 3, 6A:
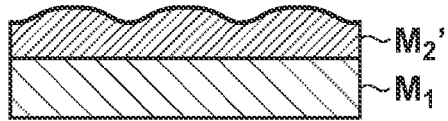
Figures 3, 6B:
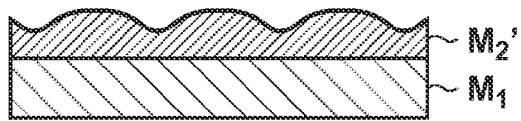
Figures 4, 6A:
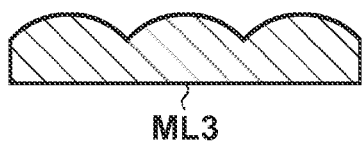
Figures 4, 6B:
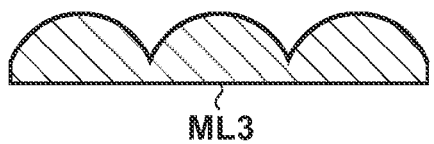

FIGS. 6A-1 to 6A-4 and 6B-1 to 6B-4 are schematic views for explaining the steps of a method of forming microlenses ML3 according to this embodiment, like FIGS. 2A-1 to 2A-4 and 2B-1 to 2B-4 (first embodiment). FIGS. 6A-1 and 6B-1 are the same as FIGS. 2A-1 and 2B-1, and a description thereof will be omitted here.

Next, as shown in FIGS. 6A-2 and 6B-2, the first shaping step, that is, the step of shaping a member $M_2$ so as to form a concavo-convex shape on its upper surface is performed. This step can be performed by exposing the member $M_2$ using a grayscale mask and then developing it, as described above. In this embodiment, the exposure light transmittance distribution of the grayscale mask is adjusted so that the concavo-convex shape of the member $M_2'$ formed in this step has different curvatures in the direction toward a side and the direction toward an angle.

Figure 7:
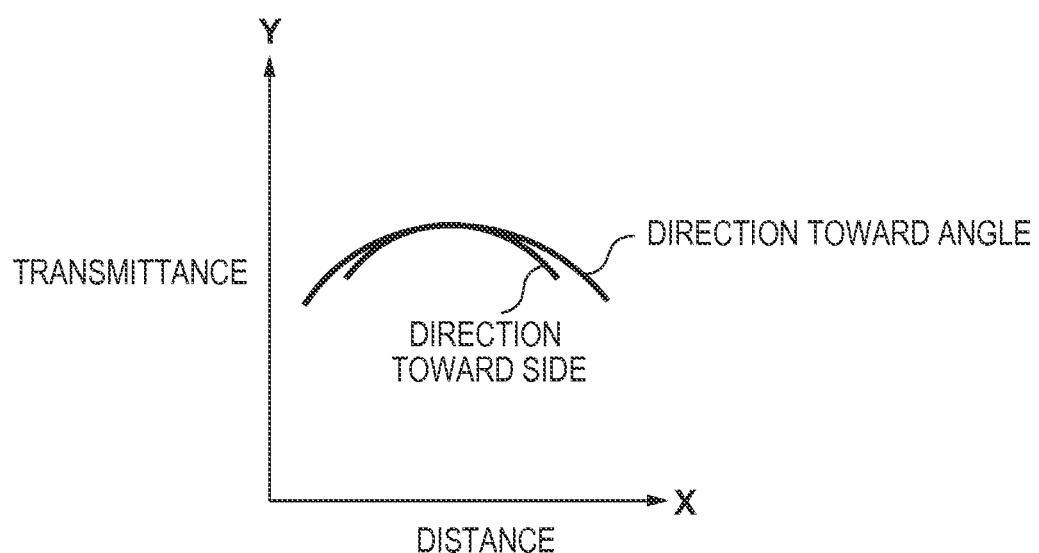
FIG. 7 is a view for explaining an example of the exposure light transmittance distribution of a grayscale mask.

FIG. 7 is a view for explaining the exposure light transmittance distribution of the grayscale mask according to this embodiment. Referring to FIG. 7, an ordinate X represents the transmittance, and an abscissa Y represents the position (distance) in the planar direction of a microlens array $A_{ML}$. Note that the projection magnification of the projection optical system of an exposure apparatus used for exposure processing is assumed to be ×1 for a descriptive convenience. In addition, the transmittance distribution in the direction toward a side and that in the direction toward an angle are illustrated so as to overlap at the center for a comparative convenience.

As shown in FIG. 7, the change rate of the transmittance distribution in the direction toward a side is higher than that in the direction toward an angle. When exposure processing using this grayscale mask and development processing are performed, the concavo-convex shape of the member $M_2$ can be formed such that the curvature in the direction toward a side becomes larger than that in the direction toward an angle.

After that, the second shaping step is performed in the same way as described above. FIGS. 6A-3 and 6B-3 show the state of the member $M_2'$ during etching.

After the second shaping step, the height difference in the direction toward a side and that in the direction toward an angle become large, that is, the curvature in the direction toward a side and that in the direction toward an angle become large, as shown in FIGS. 6A-4 and 6B-4.

According to this embodiment, it is possible to obtain the same effects as in the first embodiment and also arbitrarily control the shape of the microlenses ML3. Hence, this embodiment is advantageous in forming the microlenses ML3 in which, for example, the above-described matching ratio is higher, or the height difference or curvature is larger.

In this embodiment, the form of controlling the shape of the microlenses ML3 has been described with focus on the direction toward a side and the direction toward an angle. However, the present invention is not limited to this. For example, according to the present invention, it is possible to arbitrarily control a region R1 (region having a curvature with which the upper surface has a convex shape) shown in FIG. 3. That is, if it is possible to control the concavo-convex shape of the member $M_2'$ formed in the first shaping step and select the etching rate ratio between the members $M_1$ and $M_2'$ in the second shaping step, the shape of the microlenses can be controlled into an arbitrary shape.

For example, to further improve the condensing rate of the microlenses, they are preferably formed such that the area of the region R1 becomes larger than that of a region R2. For example, the area of the region R1 is made preferably four or more times, and more preferably, five or more times larger than the area of the region R2 when the microlens array $A_{ML}$ is viewed from the upper side.

In this embodiment, etching in the second shaping step may be performed so that portions m of the member $M_2'$ remain at the apexes of the microlenses, as in the above-described second embodiment. This embodiment is also advantageous in improving the productivity and the yield.

The microlenses formed according to each of the above-described embodiments are usable in, for example, a solid-state image sensor. For example, a solid-state image sensor manufacturing method can include steps of preparing a substrate including a photoelectric conversion element, and forming, on the substrate, a microlens corresponding to the photoelectric conversion element by the microlens forming method of each of the embodiments.

(Fourth Embodiment)

In this embodiment, a step of forming a solid-state image sensor including an asymmetric microlens will be explained. As shown in FIG. 8B, the solid-state image sensor according to this embodiment includes an asymmetric microlens 804 having an asymmetric shape with respect to the lens center. The asymmetric microlens 804 is provided on a structure 809 including photoelectric conversion elements, interconnection layers, and color filters.

The asymmetric microlens 804 condenses, on its light-receiving surface, oblique incident light that enters the peripheral portion of the imaging surface of the solid-state image sensor. The asymmetric microlens 804 is advantageous in its capability of, for example, condensing incident light having a larger incident angle, as compared to a spherical microlens. When the spherical microlenses are used, they are arranged while being shifted in the planar direction of the substrate to increase the light amount of oblique incident light to be detected by the photoelectric conversion elements. However, when the lens shift amount becomes large, the incident light is shielded by the interconnections. Hence, the condensing rate to the photoelectric conversion elements lowers. On the other hand, in case where the asymmetric microlenses 804 are used, even when the lenses are shifted, the lens shift amount can be made small as compared to the case where the spherical microlenses are used. Hence, the asymmetric microlenses are advantageous in improving the condensing rate. In addition, the asymmetric microlenses 804 can advantageously be used to prevent color mixture because they can suppress the incident angle of light to the imaging surface.

As shown in FIG. 8B, in the solid-state image sensor including the asymmetric microlens 804, a region 808 contributes to condensing to the photoelectric conversion element and is therefore preferably provided large. On the other hand, a region 805 does not contribute to condensing to the photoelectric conversion element. In addition, light from the region 805 can become a stray light component, as shown in FIG. 8B. For these reasons, the region 805 is preferably provided small.

FIGS. 8A-1 to 8A-5 are views for explaining a method of forming the asymmetric microlenses 804. FIG. 8A-1 is a plan view of asymmetric microlenses 800. FIG. 8A-2 shows the shape (designed shape) of the asymmetric microlenses 800 on the section taken along a cut line A-A'. FIG. 8A-3 shows a light transmittance distribution 802 of a photomask corresponding to the shape of the asymmetric microlenses 800. FIG. 8A-4 shows an intensity distribution 803 of light that irradiates a photoresist via the photomask. FIG. 8A-5 shows the shape (shape after development) of the asymmetric microlenses 804 formed from the photoresist after development.

A shape 806 of the asymmetric microlens at the lens design stage is different from a shape 807 of the asymmetric microlens after exposure/development. That is, the shape 806 is designed sharp, and the sharp shape changes to the rounded shape 807 during the process of processing. As shown in FIGS. 8A-3 and 8A-4, even when the photomask is provided with a region where the light transmittance sharply changes, the exposure light distribution is moderate because of diffraction of light that occurs in the exposure step, resulting in the rounded shape.

A step of changing the shape of the resist that has been rounded by the diffraction of light to the sharp shape will be described below.

Figure 9A:
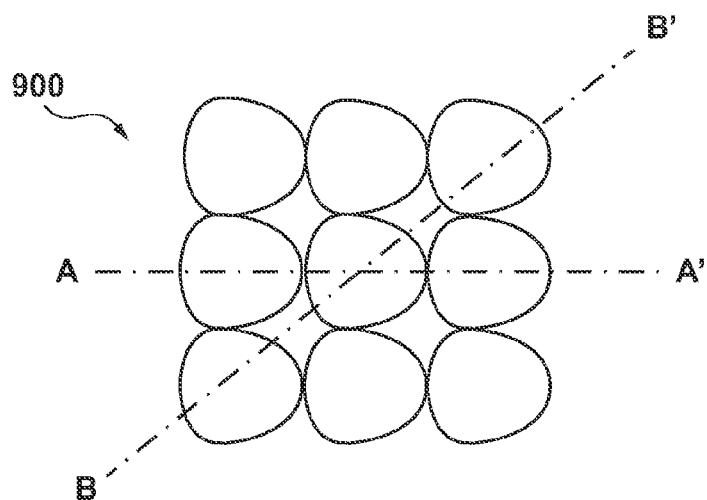
Figures 1, 9B:
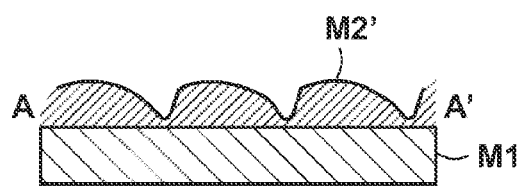
Figures 2, 9B:
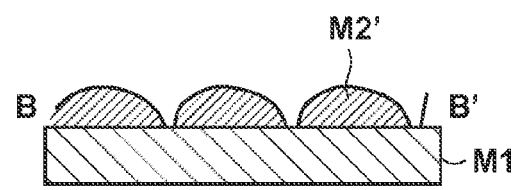
Figures 1, 9C:
Figures 2, 9C:

FIG. 9A shows a microlens array 900 in which a plurality of asymmetric microlenses each having a teardrop shape when viewed from the upper side are arranged. FIG. 9B-1 shows the shape of the microlens array 900 on a section taken along a cut line A-A' (direction toward a side) after the first shaping step. FIG. 9B-2 shows the shape of the microlens array 900 on a section taken along a cut line B-B' (direction toward an angle) after the first shaping step. A member M2' patterned by exposure/development in the first shaping step is formed on a member M1.

In this embodiment, an example is shown in which the upper surface of the member M1 is exposed in the direction toward an angle but not in the direction toward a side after the first shaping step, as shown in FIGS. 9B-1 and 9B-2. To form the microlenses having a desired shape, at least part of the upper surface of the member M1 is preferably covered by the member M2', as already described.

When asymmetric microlenses that have an ideal curvature and the like and make the utmost use of the area where the microlenses are arranged are designed, the lens height in the direction toward an angle may exceed the height formable by the member M2. However, such ideal asymmetric microlenses cannot be formed because of the process. Since the region 808 contributes to condensing of the lens, the lens design may allow the member M2' to have a portion where no lens shape is formed in a region in the direction toward an angle, where the microlenses are adjacent, and contribution to condensing is relatively small. That is, in each region where the microlenses are adjacent in the direction toward an angle, no member having a curvature is formed, and a flat portion is formed instead. This makes it possible to provide an arrangement that can be implemented even from the viewpoint of process. For this reason, in this embodiment, the upper surface of the member M1 is not covered in the direction toward an angle, as shown in FIG. 9B-2. In the direction toward a side, however, such a constraint is not present, and the upper surface of the member M1 is not exposed, as shown in FIG. 9B-1.

Four embodiments have been described above. However, the present invention is not limited to these. Various modifications can be made as needed in accordance with the object, state, application purpose, function, and other specifications, and other embodiments are also possible.

Note that a form has been described here in which the present invention is applied to a solid-state image sensor included in an imaging system represented by a camera. The concept of the imaging system includes not only apparatuses mainly aiming at shooting but also apparatuses (personal computer, portable terminal, and the like) having an auxiliary shooting function. The imaging system can also include a signal processing unit that processes a signal from the solid-state image sensor. The signal processing unit can include, for example, an A/D converter, a processor that processes digital data output from the A/D converter, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-012765, filed Jan. 27, 2014, and 2014-234005, filed Nov. 18, 2014, which are hereby incorporated by reference herein in their entirety.

What is claimed is:

1. A method for forming a plurality of microlenses arrayed in a matrix, the method comprising:
   a first step of forming, on a first member, a second member made of a material different from the first member;
   a second step of shaping an upper surface of the second member into a concavo-convex shape including a plurality of convex portions and a plurality of concave portions, by performing exposure processing using a grayscale mask, and then developing the second member; and
   a third step of forming the plurality of microlenses, corresponding to the plurality of convex portions, from at least the first member by etching the shaped second member and the first member,
   wherein in the third step, the etching of the second member and the etching of the first member are performed under a condition that an etching rate of the first member is higher than an etching rate of the second member, a portion of the first member under a concave portion of the second member is exposed during the etching of the second member, and the exposed portion of the first member is removed in the etching of the first member, wherein the plurality of convex portions include:
a first convex portion;
a second convex portion that is adjacent to the first convex portion via a concave portion; and
a third convex portion that is adjacent to the first convex portion via a concave portion and has an apex at a position farther from the first convex portion than the second convex portion, and
wherein in the second step, the portion of the first member exposed in the
third step is covered by a portion out of the concave portion of the second member located between the first convex portion and the second convex portion.

2. The method according to claim 1, wherein in the second step, the portion of the first member exposed in the third step is covered by a portion out of the concave portion of the second member located between the first convex portion and the third convex portion.

3. The method according to claim 1, wherein the microlens comprises an asymmetric microlens, and
wherein in the second step, the portion of the first member is not covered by a portion out of the concave portion of the second member located between the first convex portion and the third convex portion.

4. The method according to claim 1, wherein the second member is made of a translucent material, and
wherein in the third step, the etching is performed so as to leave a portion of the second member at an apex of the microlens.

5. The method according to claim 3, wherein a difference between a refractive index of the first member and a refractive index of the second member is not more than 0.1.

6. The method according to claim 1, wherein a height difference of the microlens formed in the third step is larger than a height difference of the concavo-convex shape of the second member formed in the second step.

7. The method according to claim 1, wherein the first member is made of an acrylic resin, and the second member is made of a styrene resin.

8. The method according to claim 1, wherein in the third step, the etching is performed such that a difference between the etching rate of the first member and the etching rate of the second member falls is from 5 Å/sec to 50 Å/sec.

9. A method for manufacturing a solid-state image sensor, the method comprising steps of:
preparing a substrate including a-photoelectric conversion elements; and
forming, on the substrate, a plurality of microlenses arrayed in a matrix corresponding to the photoelectric conversion elements by a method comprising:
a first step of forming, on a first member, a second member made of a material different from the first member;
a second step of shaping an upper surface of the second member into a concavo-convex shape including a plurality of convex portions and a plurality of concave portions, by performing exposure processing using a gray-scale mask, and then developing the second member; and
a third step of forming the plurality of microlenses, corresponding to the plurality of convex portions, from at least the first member by etching the shaped second member and the first member,
wherein in the third step, the etching of the second member and the etching of the first member are performed under a condition that an etching rate of the first member is higher than an etching rate of the second member, a portion of the first member under a concave portion of the second member is exposed during the etching of the second member, and the exposed portion of the first member is removed in the etching of the first member,
wherein the plurality of convex portions include:
a first convex portion;
a second convex portion that is adjacent to the first convex portion via a concave portion; and
a third convex portion that is adjacent to the first convex portion via a concave portion and has an apex at a position farther from the first convex portion than the second convex portion, and
wherein in the second step, the portion of the first member exposed in the third step is covered by a portion out of the concave portion of the second member located between the first convex portion and the second convex portion.

10. A method for forming a plurality of microlenses arrayed in a matrix, the method comprising:
a first step of forming, on a first member, a second member made of a material different from the first member;
a second step of shaping an upper surface of the second member into a concavo-convex shape including a plurality of convex portions and a plurality of concave portions, by performing exposure processing using a gray-scale mask, and then developing the second member; and
a third step of forming the plurality of microlenses, corresponding to the plurality of convex portions, from the first member, by etching the shaped second member and the first member,
wherein the plurality of convex portions formed in the second step, include:
a first convex portion;
a second convex portion adjacent to the first convex portion in an opposite-side direction; and
a third convex portion adjacent to the first convex portion in an opposite-corner direction, and
wherein in the second step:
a part of an upper surface of the first member is not exposed, the part being below a concave portion located between the first convex portion and the second convex portion, and
another part of the upper surface of the first member is exposed, the other part being below a concave portion located between the first convex portion and the third convex portion.

11. The method according to claim 10, wherein, in a planar view against the upper surface of the first member, a distance between an apex of the first convex portion and an apex of the second convex portion is shorter than a distance between the apex of the first convex portion and an apex of the third convex portion.

12. The method according to claim 10, wherein the etching of the second member and the etching of the first member are performed such that an etching rate of the first member is higher than an etching rate of the second member.

13. The method according to claim 10, wherein each of the plurality of microlenses comprises an asymmetric microlens.

* * * * *